Feb. 28, 1967 G. VON BERNUTH ET AL 3,307,049

TURNOFF-CONTROLLABLE THYRISTOR AND METHOD OF ITS OPERATION

Filed Dec. 18, 1964

United States Patent Office 3,307,049
Patented Feb. 28, 1967

3,307,049

TURNOFF-CONTROLLABLE THYRISTOR AND METHOD OF ITS OPERATION

Götz von Bernuth, Munich, and Eberhard Spenke, Pretzfeld, Germany, assignors to Siemens-Schuckertwerke Aktiengesellschaft, Berlin-Siemensstadt and Erlangen, Germany, a corporation of Germany Filed Dec. 18, 1964, Ser. No. 419,537
Claims priority, application Germany, Dec. 20, 1963, S 88,806
10 Claims. (Cl. 307—88.5)

Our invention relates to an electronic switch. More particularly, our invention relates to an electronic switch comprising essentially a semiconductor body such as germanium or silicon, which by means of a control current supplied through a gate or firing electrode is made conductive or non-conductive with respect to the load current.

A switch of the type of the present invention is known as a thyristor. A thyristor may comprise a four-layer device in which the semiconductor crystalline body has four sequential layers or regions of alternately opposed types of electrical conductance. To switch such a thyristor to its conductive condition, a firing current, in most cases, is passed through a control path between one of the two outer regions and the next adjacent inner region forming a p-n junction between them. Such a thyristor, when conducting load current, can be turned off by impressing a voltage between an inner region and one of the outer regions of the four-layer system in a direction which biases the p-n junction of the control path in the blocking direction and thus tends to drive a control current in the blocking direction through said p-n junction. With a sufficient magnitude of the control voltage of reversed polarity and a sufficient energy of the source of control voltage, the four-layer system can be switched to non-conducting condition between its two outer electrodes.

However, in order to permit being thus switched on and off like an electric contact switch by virtually closing and opening the load circuit, thyristors, like mechanically operated switches, must satisfy certain conditions with respect to the switching speed because otherwise the desired operation, particularly the desired interruption of the load current, cannot be achieved or maintained. That is, the switching speed, as determined by the interval of time during which the complete switching, such as the turnoff, is completed, must remain below a critical value.

It is an object of our invention to provide a thyristor which is particularly well suited to achieve the shortest possible switching time for turn-on and turnoff operation, as well as a method and circuitry for operating such a thyristor.

In accordance with the present invention, we provide a four-layer semiconductor device having alternately opposed types of conductance in the sequential layers, with an electrode and at least one attached conductor on each of the four layers. The conductors provide for applying, aside from the load current leads, a control voltage between one of the outer regions and the adjacent inner region and for applying a control voltage between the other outer region and the inner region adjacent the other outer region.

The electrical connection of such a four-layer thyristor to two sources of control voltage in addition to the load circuit, of which the entire four-layer path of the thyristor forms part, permits the following modes of operation:

(1) The thyristor may be switched on for conducting load current between its two outer electrodes, by applying a control voltage between one outer region and the adjacent inner region of the four-layer thyristor.

(2) The thyristor may be turned off for interrupting the load current, by applying a control voltage between the other outer region and the next adjacent inner region, the control voltage being of a polarity for biasing the p-n junction between these two regions in the blocking direction. That is, the control voltage for turnoff is applied with a reversed polarity across the aforementioned regions, in comparison with the polarity which the voltage drop at the p-n junction between these regions would have if produced by the load current flowing in the forward direction of said p-n junction.

(3) The thyristor may be turned on for conducting load current between its two outer electrodes, by simultaneously applying to the respective control portions of the flow path the two aforementioned control voltages of paragraphs Nos. 1 and 2. In this case, a polarity of the control voltages must be so chosen that the p-n junction between each of the two outer regions and the next adjacent inner region is biased by the one here effective control voltage in the forward direction.

(4) The thyristor may be turned off by simultaneously impressing the two aforementioned control voltages of paragraphs Nos. 1 and 2 across the respective control portions of the flow path. In this case, the control voltages have polarities such that each biases one of the p-n junctions in the blocking direction.

The present invention is based upon the recognition that, with respect to switching a thyristor for conductance between its two outer regions, the aforedescribed application of control voltages permits supplying the corresponding p-n junctions or the respective space-charge zones with charge carriers which effect a pre-ionization which enriches the depletion zones, otherwise caused by the space charges or portions thereof, with a sufficient quantity of charge carriers to compensate for such depletion.

Conversely, when a voltage of the reversed polarity with respect to the forward direction of the particular p-n junction is impressed, a corresponding suction effect is imposed upon the charge carriers, namely upon the negative ones as well as the positive carriers (electrons and defect-electrons or holes), so as to accelerate the formation of zones which become depleted of charge carriers and thus cause blocking of the current flow through the semiconductor system. The turnoff operation is thus performed in a shorter interval of time and is thereby facilitated.

In order that the present invention may be readily carried into effect, it will now be described with reference to the accompanying drawing, wherein.

Figure 1:
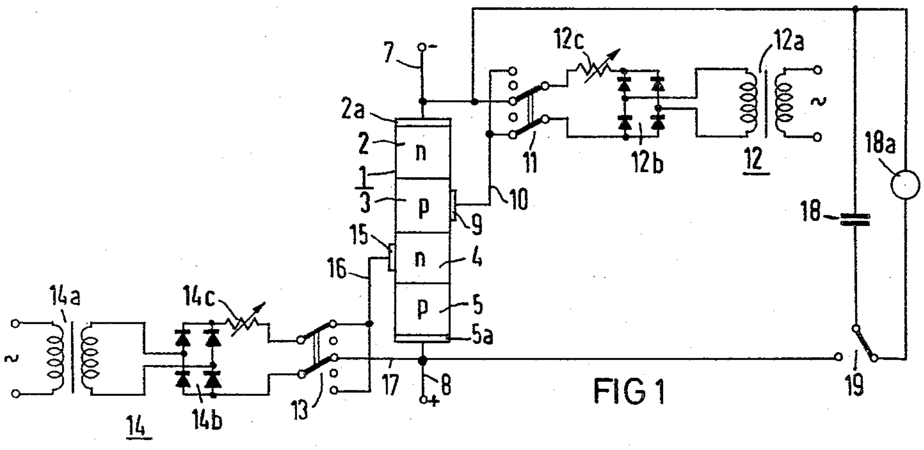
FIG. 1 is a schematic view of an embodiment of a thyristor and the associated circuitry of the present invention.

In FIG. 1, a four-layer semiconductor thyristor 1 has four layers 2, 3, 4 and 5, respectively, of alternating conductance type, following each other in sequence. The semiconductor body may be produced from a weak p conductivity type or a weak n conductivity type monocrystalline silicon body. The zones 3 and 5 of the thyristor may be produced by diffusion of a dopant and the zones 2 and 4 may be produced by allowing a different dopant.

Two supply leads 7 and 8 for the supply of the load current are connected to the outer electrode zones 2 and 5 respectively, of the thyristor. The load current is thus supplied from a voltage source (not shown) and flows in series with the thyristor through a load (not shown) which is controlled by the thyristor. The leads 7 and 8 need not be attached to narrowly limited points of the electrode regions. These regions may rather be provided with large area contact electrodes 2a and 5a adjacent to the electrode regions 2 and 5. In the schematically illustrated thyristor, the electrodes 2a and 5a may extend over the entire end faces of the respective zones 2 and 5 in order to provide a desirable uniform current density of said zones when current passes in the longitudinal direction through the load path of the semiconductor body. A lead 10 is connected to the inner region, layer, zone or area 3 via a contact electrode 9. The leads 7 and 10 are connected to a source of D.C. voltage 12 via a multiposition reversing switch 11. The source 12 of D.C. voltage includes an A.C. voltage source, a transformer 12a connected to the A.C. voltage source, a single phase rectifier 12b and an adjustable series resistance 12c connected between said rectifier and said switch.

A lead 16 is connected to the inner region, layer, zone or area 4 via a contact electrode 15. The leads 16 and 17 are connected to a source of D.C. voltage 14 via a multiposition reversing switch 13. The source 14 of D.C. voltage includes an A.C. voltage source, a transformer 14a connected to the A.C. voltage source, a single phase rectifier 14b and an adjustable series resistance 14c connected between said rectifier and said switch.

Each of the reversing switches 11 and 13 has three switch positions, so that each may be switched to a switched-off position in which they connect the corresponding D.C. voltage source to blank terminals and the lead 10 or 16 conducts no current. In another position, each of the switches 11 and 13 provides a forward direction current in its corresponding output leads. In a third position, each of the switches 11 and 13 provides a blocking direction current in its corresponding output leads.

The thyristor is then controlled in the aforedescribed manner by applying the control voltages from the D.C. voltage sources in the foregoing four modes of operation.

Figure 2:
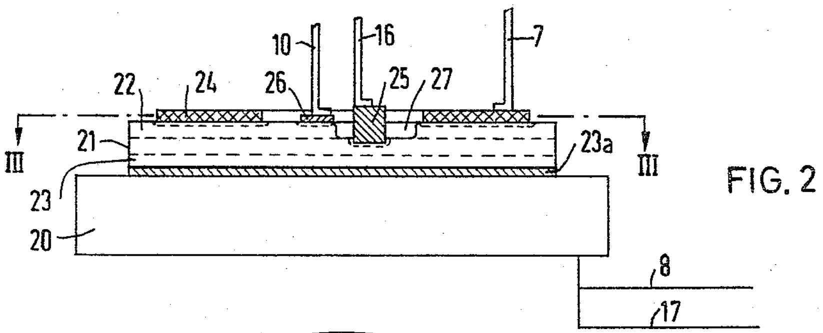
FIG. 2 is a view, partly in section, of an embodiment of a thyristor of the present invention.
Figure 3:
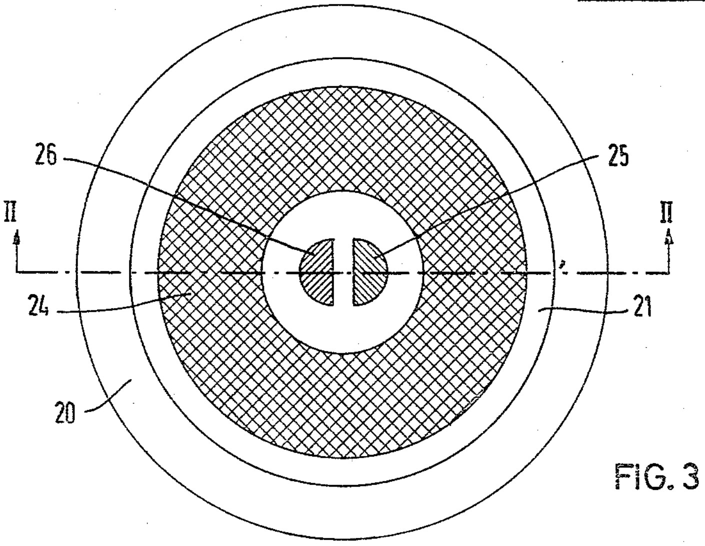
FIG. 3 is a section, taken along the line III—III of FIG. 2.

The semiconductor device of the npnp or pnpn type illustrated in FIGS. 2 and 3 is particularly well suited for the purposes of the present invention. The device comprises a supporting and bracing plate 20 of molybdenum. The molybdenum has a thermal coefficient of expansion corresponding subsantially to that of the semiconductor material, if such semiconductor material comprises germanium or silicon. In the illustrated embodiment, the crystalline semiconductor body 21 comprises weak n conductivity type silicon.

The semiconductor body is first subjected to diffusion from both flat surfaces, using an acceptor dopant which produces p conductivity type layers 22 and 23 in the semiconductor body. The layer 22 of FIG. 2 corresponds to the zone 3 of FIG. 1. The layer 21 of FIG. 2 corresponds to the zone 4 of FIG. 1. The layer 23 of FIG. 2 corresponds to the zone 5 of FIG. 1. The diffusion of the dopant need not be effected from only the two flat surfaces, but the original semiconductor body may also be subjected to diffusion on its entire flat and peripheral surfaces so as to have a core of the original n conductivity type fully enclosed within a region of the opposite conductivity type. Thereafter, a marginal portion is cut away from the semiconductor body to sever a ring-shaped portion therefrom which separates the remaining p conductivity type regions 22 and 23. The semiconductor body, then comprising the three regions 23, 21 and 22, is then alloyed at its bottom surface with doping material which produces increased p type conductivity in region 23. Particularly suitable as a dopant for this purpose is aluminum, although other acceptor impurities from the third group of the Periodic System are also applicable.

A ring-shaped electrode 24 and two separate electrodes 25 and 26, for example, of the illustrated semicircular shape, are alloyed into the top surface of the semiconductor body. The electrode material for producing the alloyed electrode 24 may consist of gold alloyed with a small amount, for example, 1 to 2% by weight, of antimony. The material for the electrode 25 may also consist of such a gold-antimony alloy. The electrode 26, however, is formed of gold with an addition of acceptor material which is preferably boron.

The alloying of the electrode 24 into the p conductivity type region 22 of the semiconductor body produces a p-n junction in said region. In contrast thereto, the electrode 26 alloyed into the p conductivity type region 22 produces an ohmic junction. The electrode 25 is alloyed to such a depth that its alloying front penetrates down to the weak n conductivity type region 21. Consequently, an ohmic junction is produced between the alloying front of the electrode 25 and the weak n conductivity type region 21.

After the alloying operations are performed in the foregoing manner, a groove 27 is cut or etched around the electrode 25. In this manner, the semiconductor material is removed down to such a depth that the original semiconductor material of region 21 emerges at the exposed surface of the semiconductor body.

The layer 23a of FIG. 2 corresponds to the electrode 5a of FIG. 1. The layer 24 of FIG. 2 corresponds to the electrode 2a and the zone 2 of FIG. 1. The layer 26 of FIG. 2 corresponds to the electrode 9 of FIG. 1. The layer 25 of FIG. 2 corresponds to the electrode 15 of FIG. 1. The molybdenum plate 20 serves as a conductor for the electrode 23a with which the p conductivity type zone 23 is completely covered; the electrode 23a being soldered to the molybdenum plate. When the thyristor is in operation, two leads 8 and 17 may be electrically connected to the molybdenum plate 20 and hence to the p conductivity type region 23. The leads 7, 8, 10, 16 and 17 of FIG. 2 correspond to the respective leads 7, 8, 10, 16 and 17 of FIG. 1 in order to facilitate comparison of the thyristor of FIGS. 2 and 3 with the schematic representation of FIG. 1.

The following results were obtained with tests made with a thyristor of the type shown in FIGS. 2 and 3. The thyristor was connected between the leads 7 and 8 in a load circuit and was controlled after a direct current flow of about 20 amps. Under these conditions, the thyristor was controlled by applying between the leads 7 and 8, and hence between the outer regions 24 and 20, a voltage from a capacitor 18 charged by a D.C. voltage source 18a (FIG. 1), this voltage having at the thyristor a polarity reversed with respect to the load voltage. The capacitor 18 is charged and discharged via a switch 19. This method of obtaining turnoff corresponds to the conventional principle of operation. A turnoff time of about 200 microseconds was measured.

The turnoff time is defined as the interval of time elapsing from the current-zero moment up to the moment when the thyristor commences to resume blocking ability. The same thyristor was then turnoff-controlled under the same load condition by applying, prior to or together with the switching of the capacitor across the thyristor main path, between the leads 16 and 17 and consequently between the outer region at 25 and the next inner region 21 of FIG. 2 (corresponding to the outer region 5 and the next inner region 4 of FIG. 1), a current of about 1 amp. in opposition to the forward direction of the p-n junction between these two regions. It was found that the turnoff time was then reduced to approximately 100 microseconds.

While the invention has been described by means of specific examples and in a specific embodiment, we do not wish to be limited thereto, for obvious modifications will occur to those skilled in the art without departing from the spirit and scope of the invention.

We claim:

1. A thyristor comprising a semiconductor body having opposite spaced surfaces and alternately opposed conductivity type layers formed therein, a first end layer of determined conductivity type forming a p-n junction with a second intermediate layer of opposite conductivity type and a third intermediate layer of said determining conductivity type forming a p-n junction with said second layer and another p-n junction with a fourth end layer of said opposite conductivity type; a conducting member in ohmic contact with one of the surfaces of said semiconductor body; a ring-shaped electrode positioned on and forming a p-n junction with the conductivity type layer at the other surface of said semiconductor body; a second electrode positioned inside and spaced from said ring-shaped electrode and forming an ohmic connection with a layer of said semiconductor body; a third electrode positioned inside and spaced from said ring-shaped electrode and spaced from said second electrode and forming an ohmic connection with a conductivity type layer of said semiconductor body different from the layers contacted by said ring-shaped electrode and said second electrode; an electrical conductor connected to each of said ring-shaped, second and third electrodes and to said conducting member; and circuit means connected to the conductors connected to said electrodes for applying a first control voltage of selectively reversible polarity between a first pair of said conductors and for applying a second control voltage of selectively reversible polarity to a second pair of said conductors.

2. A thyristor as claimed in claim 1, wherein each of said second and third electrodes is of semicircular cross section having a substantially planar side, said second and third electrodes being positioned with their planar sides opposite and spaced from each other.

3. A thyristor as claimed in claim 2, wherein one of said second and third electrodes penetrates farther into said semiconductor body than the other.

4. A thyristor circuit comprising a thyristor having a semiconductor body having a first end region of determined conductivity type, a second intermediate region of opposite conductivity type forming a p-n junction with said first region, a third intermediate region of said determined conductivity type forming a p-n junction with said second region, a fourth end region of said opposite conductivity type forming a p-n junction with said third region, an electrode connected to each of said first, second, third and fourth regions and an electrical conductor connected to each of said electrodes, and circuit means for applying a first control voltage of selectively reversible polarity between the electrical conductors connected to said first and second regions and applying a second control voltage of selectively reversible polarity between the electrical conductors connected to said third and fourth regions.

5. A thyristor circuit as claimed in claim 4, further comprising means for supplying a load current to said first and fourth regions through the electrodes connected thereto.

6. A thyristor circuit as claimed in claim 4, further comprising means for applying a third control voltage between the conductors connected to said first and fourth regions.

7. A thyristor circuit as claimed in claim 6, wherein said circuit means comprises for applying a third control voltage between the conductors connected to said first and fourth regions comprises a source of voltage, a capacitor and switch means for selectively connecting said capacitor across said voltage source in one position to charge said capacitor and for connecting said capacitor across said conductors connected to said first and fourth regions in another position to discharge said capacitor.

8. A method of operation of a thyristor, comprising the steps of providing a semiconductor body with four layers of alternately opposed conductivity type positioned adjacent each other in a manner whereby a first and second of said layers forms a p-n junction, said second and a third of said layers forms another p-n junction and said third and a fourth of said layers forms still another p-n junction; and applying a selectively reversible control voltage between one end layer and the next adjacent layer and between the opposite end layer and the next adjacent layer.

9. A method of operation of a thyristor, comprising the steps of providing a semiconductor body with four layers of alternatively opposed conductivity type positioned adjacent each other in a manner whereby a first and second of said layers forms a p-n junction, said second and a third of said layers forms another p-n junction and said third and a fourth of said layers forms still another p-n junction; applying a selectively reversible control voltage between one end layer and the next adjacent layer and between the opposite end layer and the next adjacent layer; and applying a control voltage between both end layers.

10. A method of operation of a thyristor, comprising the steps of providing a semiconductor body with four layers of alternately opposed conductivity type positioned adjacent each other in a manner whereby a first and second of said layers forms a p-n junction, said second and a third of said layers forms another p-n junction and said third and a fourth of said layers forms still another p-n junction; applying a selectively reversible control voltage between one end layer and the next adjacent layer and between the opposite end layer and the next adjacent layer; selectively charging a capacitor; and selectively discharging said capacitor across both end layers.

References Cited by the Examiner

UNITED STATES PATENTS

| | | | |
|---|---|---|---|
| 2,569,347 | 9/1951 | Shockley | 317—235 |
| 2,655,610 | 10/1953 | Ebers | 317—235 |
| 2,735,948 | 2/1956 | Sziklai | 307—88.5 |
| 2,938,130 | 5/1960 | Noll | 307—88.5 |
| 3,078,391 | 2/1963 | Bunodiere et al. | 315—205 |

JOHN W. HUCKERT, *Primary Examiner.*

R. SANDLER, *Assistant Examiner.*